United States Patent
Jeon et al.

(10) Patent No.: US 9,711,198 B1
(45) Date of Patent: Jul. 18, 2017

(54) SEMICONDUCTOR DEVICE FOR CONTROL READ OR WRITE OPERATION USING A BANK ADDRESS AND SYSTEM INCLUDING THE SAME

(71) Applicant: SK hynix Inc., Icheon-si, Gyeonggi-do (KR)

(72) Inventors: Seon Kwang Jeon, Yongin-si (KR); Bo Ra Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/197,954

(22) Filed: Jun. 30, 2016

(30) Foreign Application Priority Data

Apr. 1, 2016 (KR) ........................ 10-2016-0040380

(51) Int. Cl.
| | | |
|---|---|---|
| *G11C 7/22* | (2006.01) | |
| *G11C 8/18* | (2006.01) | |
| *G11C 11/4094* | (2006.01) | |
| *G11C 19/28* | (2006.01) | |
| *G11C 11/408* | (2006.01) | |
| *G11C 19/18* | (2006.01) | |
| *G11C 11/419* | (2006.01) | |
| *G11C 11/418* | (2006.01) | |

(52) U.S. Cl.
CPC ............... *G11C 7/222* (2013.01); *G11C 8/18* (2013.01); *G11C 11/408* (2013.01); *G11C 11/4094* (2013.01); *G11C 11/418* (2013.01); *G11C 11/419* (2013.01); *G11C 19/188* (2013.01); *G11C 19/287* (2013.01)

(58) Field of Classification Search
CPC . G11C 11/4094; G11C 11/419; G11C 11/418; G11C 11/408; G11C 19/188; G11C 19/287
See application file for complete search history.

(56) References Cited

U.S. PATENT DOCUMENTS

| | | | |
|---|---|---|---|
| 6,253,340 B1 * | 6/2001 | Cowles | ............ G01R 31/31850 711/100 |
| 7,643,334 B1 | 1/2010 | Lee et al. | |
| 2015/0243347 A1 * | 8/2015 | Hayashi | ................ G11C 11/408 365/230.03 |
| 2016/0266804 A1 * | 9/2016 | Shimizu | ................ G06F 3/0604 |

* cited by examiner

*Primary Examiner* — Vanthu Nguyen
(74) *Attorney, Agent, or Firm* — William Park & Associates Ltd.

(57) ABSTRACT

In accordance with an embodiment of the present disclosure, a semiconductor device may be provided. The semiconductor device may semiconductor device may be configured to store a bank address applied to an active signal from among command signals, and may perform a read or a write operation using the stored bank address based on activation of a command signal.

20 Claims, 6 Drawing Sheets

SEMICONDUCTOR DEVICE FOR CONTROL READ OR WRITE OPERATION USING A BANK ADDRESS AND SYSTEM INCLUDING THE SAME

CROSS-REFERENCE TO RELATED APPLICATION

This application claims priority based upon Korean patent application No. 10-2016-0040380, filed on Apr. 1, 2016, the disclosure of which is hereby incorporated in its entirety by reference herein.

BACKGROUND

1. Technical Field

Embodiments of the present disclosure may generally relate to a semiconductor device and a system including the same, and more particularly to a technology relating to transmission efficiency of commands and data for the semiconductor device.

2. Related Art

Generally, a semiconductor system may include a master device such as a processor or a controller. A semiconductor system may also include a slave device such as a memory or a data storage unit. The master device and the slave device may communicate to implement data communication therebetween. The master device and the slave device may operate on the basis of a clock signal. The master device may transmit a clock signal to the slave device.

In addition, the master device and the slave device may perform data communication using a clock signal synchronous scheme such that data can be accurately communicated between the master device and the slave device. In other words, the master device may transmit data to the slave device in synchronization with the clock signal, and the slave device may transmit data to the master device in synchronization with the clock signal.

SUMMARY

In accordance with an embodiment of the present disclosure, a semiconductor device may be provided. The semiconductor device may semiconductor device may be configured to store a bank address applied to an active signal from among command signals, and may perform a read or a write operation using the stored bank address based on activation of a command signal.

In accordance with an embodiment of the present disclosure, a semiconductor device may be provided. The semiconductor device comprising: a decoder configured to receive a clock signal, command signals, and a command address; a register configured to store a first bank address applied to a first active signal from among the command signals; and a bank configured to perform a read or write operation using the stored first bank address based on activation of a command signals.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a semiconductor device and a system including the same that substantially obviate one or more problems due to limitations and disadvantages of the related art.

An embodiment of the present disclosure may generally relate to a technology for applying a bank address from among commands supplied to a semiconductor device to read and/or write operation(s), resulting in the reduction of a clock cycle needed for command execution.

Figure 1:
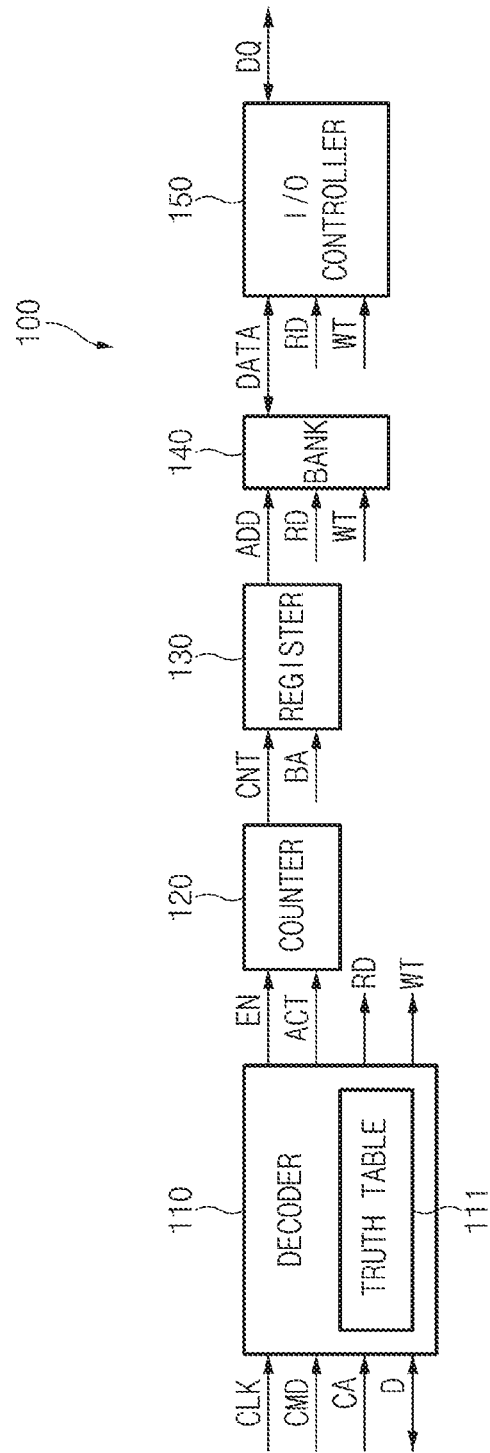
FIG. 1 is a block diagram illustrating a representation of an example of a semiconductor device according to an embodiment of the present disclosure.

FIG. 1 is a block diagram illustrating a representation of an example of a semiconductor device 100 according to an embodiment of the present disclosure.

Referring to FIG. 1, the semiconductor device 100 may include a decoder 110, a counter 120, a register 130, a bank 140, and an input and output (input/output) (I/O) controller 150. In an embodiment, the decoder 110 may include a truth table 111 configured to store information regarding an address pin of a command signal.

The decoder 110 may decode a clock CLK, a command signal CMD, a command address CA, and data D, and may thus output an enable signal EN, an active signal ACT, a read signal RD, and a write signal WT. In an embodiment, the command signal CMD may include a selection signal, a mode register set signal, a write signal, an active signal, a read signal, a power down signal, a ZQ calibration signal, etc.

The truth table 111 may store an operation OP code signal, a logic level, etc. of an address applied to an address pin to execute a command corresponding to a function of the command signal CMD. Accordingly, the decoder 110 may recognize data applied to the rising or falling clock cycle for each pin, as an address, by referring to the truth table 111.

For example, OP code signals and logic levels regarding active signals (ACT1, ACT2), a read active signal ACT_RD, a write signal WRITE, etc. to be described later, are stored while being classified according to respective bits in the truth table 111, such that the resultant OP code signals and logic levels may be allocated to addresses in the truth table 111. In an embodiment, the above-mentioned respective signals stored in the truth table 111 may be allocated to different OP code signals.

The counter 120 may count the active signal ACT when the enable signal EN is activated, and thus output a count signal CNT to the register 130. For example, the counter 120 may perform the counting operation when the enable signal EN is activated to a high level. The counter 120 may count the active signal ACT, may activate the count signal CNT after lapse of 3 clock cycles, and may thus output the activated count signal CNT.

The register 130 may store a bank address BA in response to the count signal CNT. In an embodiment, the bank address BA may correspond to a first bank address BA from among command addresses (CAs) received in response to a first command signal CMD.

If the count signal CNT reaches a predetermined number of counting times and is then activated, the register 130 may output the bank address BA, as the address ADD, to the bank 140.

In other words, assuming that the first bank address BA is stored and the count signal CNT is then activated, the bank address BA is output as the address ADD.

The bank 140 may perform the read operation in response to the address ADD and the read signal RD, or may perform the write operation in response to the address ADD and the write signal WT. That is, the bank 140 may output data DATA to the I/O controller 150 in response to the read signal RD during the read operation.

For example, assuming that the read signal RD is activated after a specific cell is selected by the address ADD, the bank 140 may output the stored data DATA. The bank 140 may receive data DATA from the I/O controller 150 in response to the write signal WT during the write operation.

In an embodiment of the present disclosure, the bank 140 may include a non-volatile memory device capable of preserving stored data even when not powered. For example, the non-volatile memory device may be implemented as a Phase Change Random Access Memory (PCRAM), a flash memory device such as a NAND flash or a NOR flash, a Ferroelectric Random Access Memory (FeRAM), a Magnetic Random Access Memory (MRAM), or a Resistive Random Access Memory (ReRAM), etc.

The non-volatile memory device may be used in a system in which data needs to be persistently maintained. For example, the non-volatile memory device may be applied to digital cameras to persistently store images therein. In an example, the non-volatile memory device may be applied to digital music players to persistently store audio data therein.

In an embodiment, the bank 140 may include a memory cell array, a row decoder, a column decoder, a data I/O unit, an interface unit, a control logic, etc. For example, the memory cell array may include a plurality of memory cells configured to store data therein. The control logic may control overall operations, for example, the write, read, and delete operations, of the non-volatile memory device upon receiving a command from the controller.

The I/O controller 150 may detect data DATA in response to the read signal RD, and may then output data DQ to the external part. The I/O controller 150 may drive data DQ received from the external part in response to the write signal WT, and may thus output data DATA to the bank 140.

Figure 2:
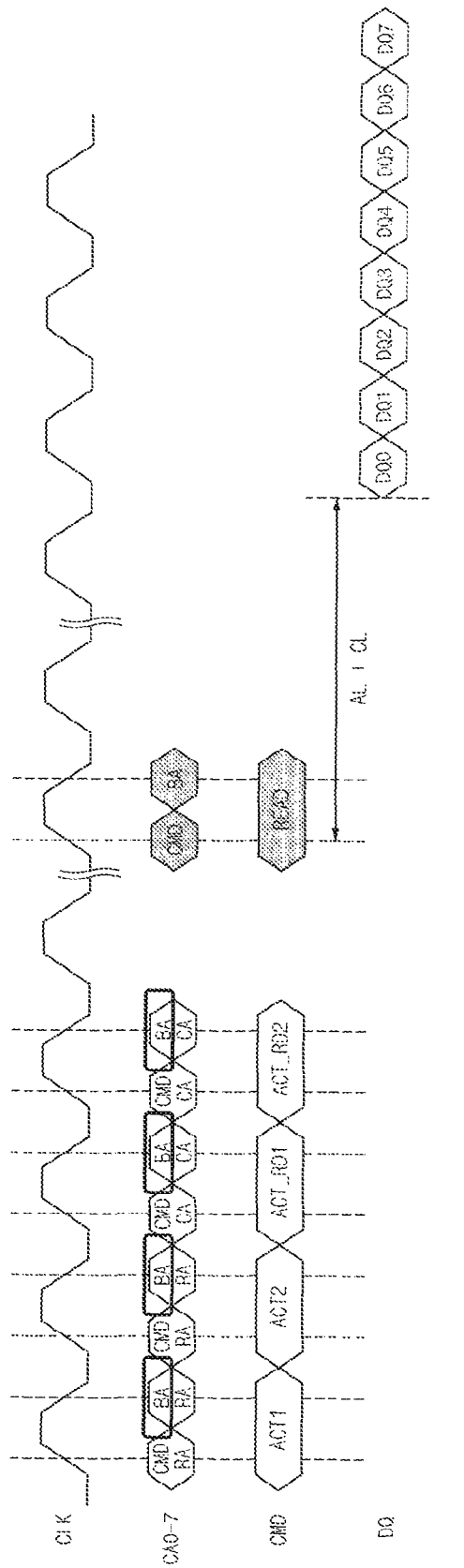
FIG. 2 is a timing diagram illustrating a representation of an example of a read operation time point of a semiconductor device.

FIG. 2 is a timing diagram illustrating a representation of an example of the read operation time point of a semiconductor device.

Referring to FIG. 2, a command address CA (i.e., CA 0-7, command addresses zero to seven) may be received in synchronization with the clock CLK. A first active signal ACT1 may be applied as the command signal CMD, and a row address code signal CMD_RA and a bank address BA may be applied as the command address CA. That is, the row address code signal CMD_RA and the bank address BA may be applied when the first active signal ACT1 is activated during one cycle of the clock CLK.

Thereafter, a second active signal ACT2 may be applied as the command signal CMD, and the row address code signal CMD_RA and the bank address BA may be applied as the command address CA. That is, the row address code signal CMD_RA and the bank address BA may be applied when the second active signal ACT2 is activated during one cycle of the clock CLK.

Thereafter, a first read active signal ACT_RD1 may be applied as the command signal CMD, and the column address code signal CMD_CA and the bank address BA may be applied as the command address CA. That is, the column address code signal CMD_CA and the bank address BA may be applied when the first read active signal ACT_RD1 is activated during one cycle of the clock CLK.

Subsequently, a second read active signal ACT_RD2 may be applied as the command signal CMD, and the column address code signal CMD_CA and the bank address BA may be applied as the command address CA. That is, the column address code signal CMD_CA and the bank address BA may be applied when the second read active signal ACT_RD2 is activated during one cycle of the clock CLK.

Thereafter, a read signal READ may be applied as the command signal CMD, and data DQ0~DQ7 may be output after lapse of a predetermined time "AL(Additive Latency)+ CL(CAS Latency)".

However, a general semiconductor device may repeatedly receive the bank address BA four times, as the command address, during the above-mentioned read operation. In this case, the number of addresses that must be transferred to the semiconductor device during the read operation may unavoidably increase from the viewpoint of an external host.

Figure 3:
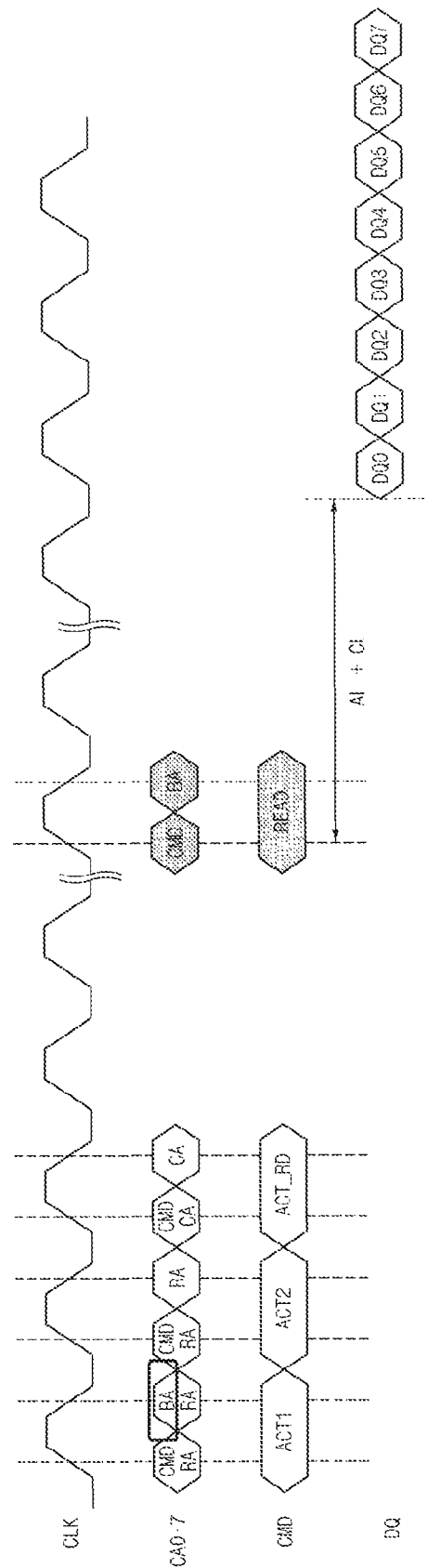
FIG. 3 is a timing diagram illustrating a representation of an example of a read operation of a semiconductor device illustrated in FIG. 1.

FIG. 3 is a timing diagram illustrating a representation of an example of the read operation of a semiconductor device illustrated in FIG. 1.

Referring to FIG. 3, a command address CA (i.e., CA 0-7, command addresses zero to seven) may be received in synchronization with the clock CLK. A row address code signal CMD_RA and a bank address BA may be applied as the command address CA. That is, the row address code signal CMD_RA and the bank address BA may be applied when the first active signal ACT1 is activated during one cycle of the clock CLK.

Thereafter, a second active signal ACT2 may be applied as the command signal CMD, and the row address code signal CMD_RA and the row address RA may be applied as the command address CA. That is, the row address code signal CMD_RA and the row address RA may be applied when the second active signal ACT2 is activated during one cycle of the clock CLK.

Thereafter, a read active signal ACT_RD may be applied as the command signal, and the column address code signal CMD_CA and the column address CA may be applied as the command address CA. That is, the column address code signal CMD_CA and the column address CA may be applied when the read active signal ACT_RD is activated during one cycle of the clock CLK.

In an embodiment, it may be assumed that the active signals (ACT1, ACT2) and the read active signal ACT_RD are sequentially input. As a result, it may be assumed that the bank address BA received in the first active signal ACT1 is also valid not only in the second active signal ACT2 but also in the read active signal ACT_RD.

Referring to the truth table 111 illustrated in an embodiment, the bank address BA may be applied only to the command address pin of the first active signal ACT1. In addition, the bank address BA may not be allocated to the remaining command address pins of the second active signal ACT2 and the read active signal ACT_RD.

As a result, as many row or column addresses as the number of bank addresses needed for the active signal ACT2 or the read active signal ACT_RD may also be used as necessary. As a result, an embodiment of the present disclosure can greatly reduce the number of address pins allocated to the bank address BA.

Thereafter, the read signal READ may be applied as the command signal CMD, and data DQ0~DQ7 may be output after lapse of a predetermined time "AL(Additive Latency)+CL(CAS Latency)".

As described above, the semiconductor device according to an embodiment of the present disclosure may perform the read operation in response to the bank address BA to be received at a predetermined time at which the first active signal ACT1 is applied to the semiconductor device.

That is, as can be seen from the read operation of FIG. 2, after the active signals (ACT1, ACT2) and the read signals (ACT_RD1, ACT_RD2) are applied to the semiconductor device during four clock cycles, the read operation is then performed, such that a total of 5 clock cycles may be consumed during the read operation.

However, as can be seen from the read operation of FIG. 3, after the active signals (ACT1, ACT2) and the read active signal ACT_RD are applied to the semiconductor device during three clock cycles, the read signal READ is applied such that the read operation is performed, such that a total of four clock cycles may be consumed during the read operation. Therefore, a time consumed for the read operation of FIG. 3 may be shorter than a time consumed for the read operation of FIG. 2 by a predetermined time corresponding to one clock cycle.

During the read operation of FIG. 2, the bank address BA may be received four times in response to the active signals (ACT1, ACT2) and the read signals (ACT_RD1, ACT_RD2). However, according to a semiconductor device of an embodiment, only one bank address BA may be received in response to the first active signal ACT1. In addition, during the read operation, data DATA stored in the bank 140 may be output in response to the bank address BA stored in the register 130.

Therefore, the semiconductor device according to an embodiment can greatly reduce the number of necessary bank addresses as compared to, for example, a semiconductor device according to FIG. 2. That is, the semiconductor device of an embodiment may reduce the number of addresses, each of which is allocated as the bank address, in the truth table 111 of the decoder 110.

Figure 4:
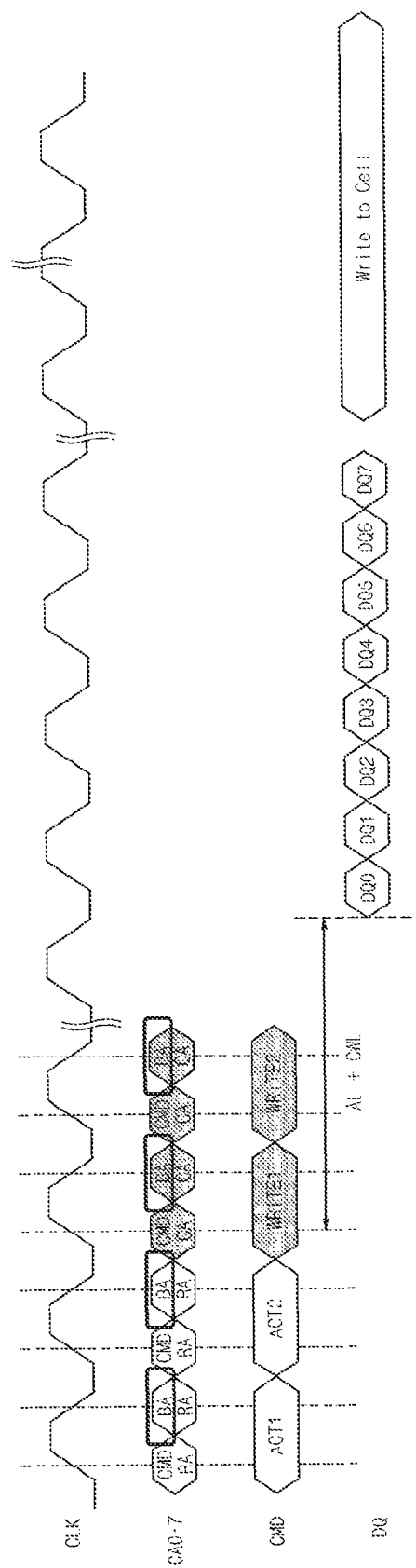
FIG. 4 is a timing diagram illustrating a representation of an example of a write operation time point of a semiconductor device.

FIG. 4 is a timing diagram illustrating a representation of an example of the write operation time point of a semiconductor device.

Referring to FIG. 4, the command address CA (i.e., CA 0-7, command addresses zero to seven) may be received or input in response to the clock CLK. The first active signal ACT1 may be received as the command signal CMD, and the row address code signal CMD_RA and the bank address BA may be received or input as the command address CA. In other words, the row address code signal CMD_RA and the bank address BA may be received when the first active signal ACT1 is activated during one cycle of the clock CLK.

After that, the second active signal ACT2 may be received as the command signal CMD, and the row address code signal CMD_RA and the bank address BA may be received or input as the command address CA. In other words, the row address code signal CMD_RA and the bank address BA may be received when the second active signal ACT2 is activated during one cycle of the clock CLK.

Thereafter, a first write signal WRITE1 may be received as the command signal CMD, and the column address code signal CMD_CA and the bank address BA may be received as the command address CA. In other words, the column address code signal CMD_CA and the bank address BA may be received when the first write signal WRITE1 is activated during one cycle of the clock CLK.

Subsequently, a second write signal WRITE1 may be received as the command signal CMD, and the column address code signal CMD_CA and the bank address BA may be received or input as the command address CA. In other words, the column address code signal CMD_CA and the bank address BA may be received when the second write signal WRITE2 is activated during one cycle of the clock CLK.

After the second write signal WRITE2 is received or input, data DQ0~DQ7 may be input after lapse of a predetermined time "AL(Additive Latency)+CWA(CAS Write Latency)", and the resultant data DQ0~DQ7 may then be written in the cell.

However, a general semiconductor device may repeatedly receive the bank address BA four times, as the command address, during the above-mentioned write operation. In this case, the number of addresses that must be transferred to the semiconductor device during the write operation may unavoidably increase from the viewpoint of the external host.

Figure 5:
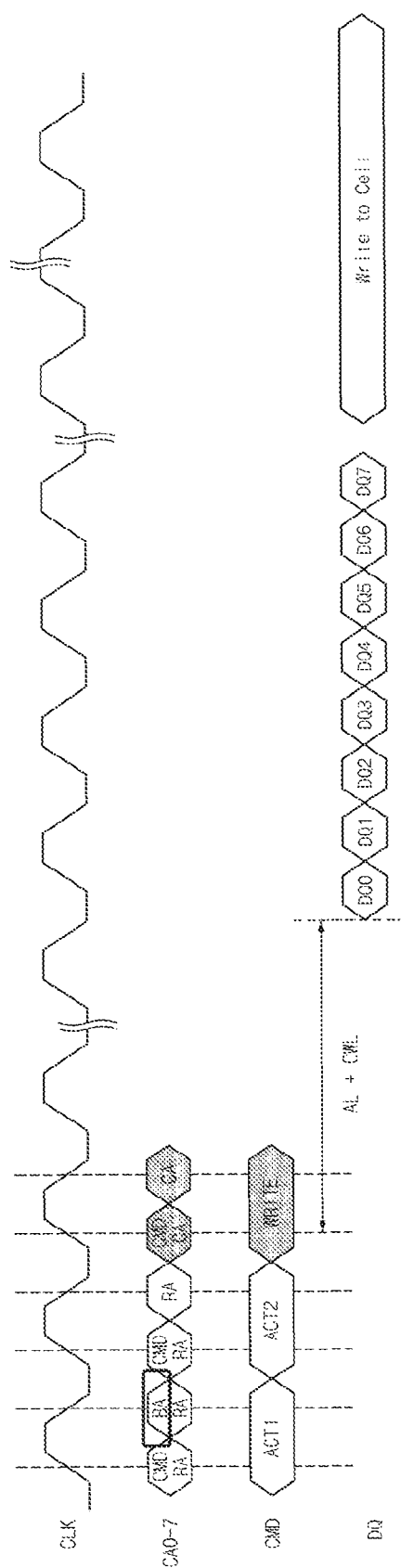
FIG. 5 is a timing diagram illustrating a representation of an example of a write operation of a semiconductor device illustrated in FIG. 1.

FIG. 5 is a timing diagram illustrating a representation of an example of the write operation of a semiconductor device illustrated in FIG. 1.

Referring to FIG. 5, the command address CA (i.e., CA 0-7, command addresses zero to seven) may be received or input in synchronization with the clock CLK. The first active signal ACT1 may be received as the command signal CMD, and the row address code signal CMD_RA and the bank address BA may be received as the address CA. In other words, the row address code signal CMD_RA and the bank address BA may be received when the first active signal ACT1 is activated during one cycle of the clock CLK.

After that, the second active signal ACT2 may be received as the command signal CMD, and the row address code signal CMD_RA and the row address RA may be applied as the command address CA. In other words, the row address code signal CMD_RA and the row address RA may be applied when the second active signal ACT2 is activated during one cycle of the clock CLK.

Thereafter, the write signal WRITE may be applied as the command signal CMD, and the column address code signal CMD_CA and the column address CA may be applied as the command address CA. In other words, the column address code signal CMD_CA and the column address CA may be applied when the write signal WRITE is activated during one cycle of the clock CLK.

In an embodiment, it may be assumed that the active signals (ACT1, ACT2) and the write signal WRITE are sequentially input. As a result, it may be assumed that the bank address BA received in the first active signal ACT1 is also valid not only in the second active signal ACT2 but also in the write signal WRITE.

Referring to the truth table 111 illustrated in an embodiment, the bank address BA may be applied only to the command address pin of the first active signal ACT1. In addition, the bank address BA may not be allocated to the remaining command address pins of the second active signal ACT2 and the write signal WRITE.

As a result, as many row or column addresses as the number of bank addresses needed for the active signal ACT2 or the write signal WRITE may also be used as necessary. As a result, an embodiment of the present disclosure can greatly reduce the number of address pins allocated to the bank address BA.

After the write signal WRITE is applied to the semiconductor device, data DQ0~DQ7 may be input after lapse of a predetermined time "AL(Additive Latency)+CWL(CAS Write Latency)", and the resultant data DQ0~DQ7 may then be written in the cell.

As described above, the semiconductor device according to an embodiment of the present disclosure may perform the write operation in response to the bank address BA to be received at a predetermined time at which the first active signal ACT1 is applied to the semiconductor device.

That is, as can be seen from the write operation of FIG. 4, after the active signals (ACT1, ACT2) and the write signals (WRITE1, WRITE2) are applied to the semiconductor device during four clock cycles, the write operation is then performed, such that a total of 4 clock cycles may be consumed during the write operation.

However, as can be seen from the write operation of FIG. 5, after the active signals (ACT1, ACT2) and the write signal WRITE are applied to the semiconductor device during three clock cycles, the semiconductor device performs the write operation, such that a total of three clock cycles may be consumed during the write operation. Therefore, a time consumed for the write operation of FIG. 5 may be shorter than a time consumed for the read operation of FIG. 4 by a predetermined time corresponding to one clock cycle.

In addition, during the write operation of FIG. 5, the bank address BA may be received four times in response to the active signals (ACT1, ACT2) and the write signals (WRITE1, WRITE2). However, according to a semiconductor device of an embodiment, only one bank address BA may be received in response to the first active signal ACT1. In addition, during the write operation, data DATA may be input to the bank 140 in response to the bank address BA stored in the register 130.

Therefore, the semiconductor device according to an embodiment can greatly reduce the number of necessary bank addresses as compared to, for example, a semiconductor device according to FIG. 4. That is, the semiconductor device of an embodiment may reduce the number of addresses, each of which is allocated as the bank address, in the truth table 111 of the decoder 110.

Assuming that the semiconductor memory device is implemented as a PCRAM, output signals of the PCRAM may be combined with the active signal ACT, the read active signal ACT_RD, and the write signal WRITE due to memory characteristics, such that an address is generated. Furthermore, since the PCRAM has a small page size, a large number of addresses to be simultaneously transmitted to only one clock is needed, resulting in large power consumption.

However, there may arise data bubbles when the read active signal ACT_RD is applied for two clocks as illustrated in FIG. 2. In other words, the command signal CMD applied to the decoder 110 has multiple phases, such that data efficiency may be reduced when the same number of clock cycles are consumed for each command signal.

For example, assuming that two clock cycles are consumed per command signal to perform the corresponding command, the command signal must be applied at intervals of four clock cycles according to tCCD (CAS to CAS Delay time). However, as can be seen from FIG. 2, since the command signal must be applied at intervals of 5 clock cycles, there arise data bubbles.

There is a need for a representative flash memory of non-volatile memories to include a high-internal-voltage circuit therein because a high operation voltage is needed, resulting in reduction of the chip region use efficiency. In addition, there is a limitation on the number of data record times, and scaling for guaranteeing data retention characteristics may also be limited.

The next-generation non-volatile memories developed to overcome technical limitations of flash memory may refer to ideal memories having various advantages, for example, non-volatile characteristics, high processing speed, random access, low power consumption, super-miniaturized size, safety, etc.

The next-generation non-volatile memories may be classified into Ferroelectric Random Access Memory (FeRAM), Magnetic Random Access Memory (MRAM), Phase Change Random Access Memory (PCRAM), Resistive Random Access Memory (ReRAM), Polymer Random Access Memory (PoRAM), etc. according to structures of unit memory cells or categories of data storage materials.

From among the above-mentioned non-volatile memories, a Resistance Random Access Memory (RRAM) such as PCRAM or ReRAM may define an information storage state according to resistance states of data storage materials. During the program operation, the RRAM may apply a program current through which a data storage material has a necessary storage state. The program current may be supplied through a write driver, and pulse shapes of the program current actually applied to the cell may be changed according to cell positions acquired from the write driver.

The semiconductor device according to an embodiment of the present disclosure may reduce the read operation time by activating only one read active signal ACT_RD during one clock cycle, upon receiving the second active signal ACT2. In addition, the semiconductor device may reduce the write operation time by activating only one write signal WRITE during one clock cycle, upon receiving the second active signal ACT2.

Therefore, the semiconductor device may prevent occurrence of data bubbles by transmitting data within a predetermined time of tCCD (CAS to CAS Delay). The semiconductor memory device may successively receive the read command RD and the write command WT acting as column command signals. The predetermined time (tCCD) may refer to a predetermined time defined as a specification in association with the above-mentioned characteristics.

Lines needed for data transmission of the semiconductor memory device must be precharged with a predetermined voltage. During the predetermined time (tCCD), one column selection signal is activated for data transmission, each line is precharged, and the next column selection signal is then activated. For stable data transmission, the precharge operation must be stably completed within the predetermined time (tCCD).

The operation performance of the semiconductor memory device may be determined on the basis of, for example, the processing speed and power consumption. Therefore, intensive research is being conducted to improved semiconductor memory devices capable of implementing lower power consumption and higher processing speed.

Figure 6:
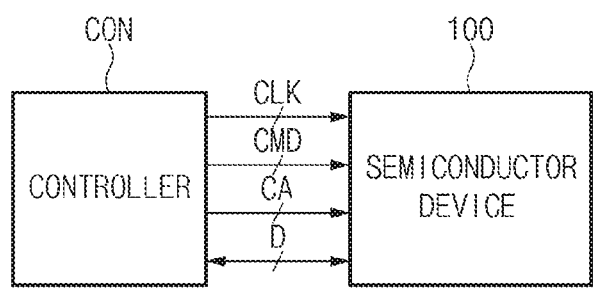
FIG. 6 is a timing diagram illustrating a representation of an example of a semiconductor device according to an embodiment of the present disclosure.

FIG. 6 is a timing diagram illustrating a representation of an example of a semiconductor device according to an embodiment of the present disclosure.

Referring to FIG. 6, the system including the semiconductor device of an embodiment may include a controller CON and a semiconductor device 100.

The controller CON and the semiconductor device 100 may communicate with each other such that data can be communicated therebetween. The controller CON may control the operation of the semiconductor device 100.

Although the semiconductor device 100 according to an embodiment may perform the read and write operations of data, and the controller CON may control the semiconductor device 100 to perform the read and write operations, the scope or spirit of the present disclosure is not limited thereto.

The controller CON may transmit various control signals to the semiconductor device 100 through a plurality of buses, to control the semiconductor device 100. The controller CON may transmit at least two clock CLK signals, the command signal CMD, the command address CA, and data D to the semiconductor device 100. Accordingly, the controller CON may perform the write operation to allow the semiconductor device 100 to store data, and may perform the read operation to allow the semiconductor device 100 to output data stored in the memory.

In an embodiment, the controller CON may be a master device configured to control the semiconductor device 100. The controller CON may be a Central Processing Unit (CPU), a Graphics Processing Unit (GPU), a Digital Signal Processor (DSP), an Application Processor (AP), and a controller chip.

The semiconductor device 100 may be configured to perform the operations illustrated in FIGS. 1, 3, and 5. Accordingly, during the write or read operation, the semiconductor device may not receive the bank address BA, for example, at least two times, may receive only one bank address BA upon receiving the active signal ACT1, and may then store the resultant bank address BA in the register 130.

Therefore, assuming that the command address CA is transferred from the controller CON to the semiconductor device 100, the semiconductor device 100 may store only the first bank address BA from among command addresses CAs in the register 130. For this purpose, the controller CON may store various kinds of program data for controlling the semiconductor device 100 therein. For example, the controller CON may store mapping operation information for mapping addresses, logic address information, etc. therein.

As is apparent from the above description, the semiconductor device according to embodiments reduces a clock cycle needed for command execution by applying a bank address to the read and/or write operation(s), resulting in increased transmission efficiency of each command and data.

Those skilled in the art will appreciate that the examples may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
a decoder configured to output an enable signal, an active signal, a read signal, and a write signal by decoding at least one command signal and a command address;
a counter configured to output a count signal by counting the active signal when the enable signal is activated;
a register configured to store a bank address from among the command addresses, and output the stored bank address as an address when the count signal is activated; and
a bank in which a read or write operation of data is performed, based on the address applied to the register, the read signal, and the write signal,
wherein the register is configured to store a first bank address received based on a first active signal from among the command signals.

2. The semiconductor device according to claim 1, further comprising:
an input and output (input/output) (I/O) controller configured to output data received from the bank based on the read signal, and output data to the bank based on the write signal.

3. The semiconductor device according to claim 1, wherein the decoder includes:
a truth table configured to store information applied to an address pin to execute a command corresponding to a function of the command signal.

4. The semiconductor device according to claim 3, wherein:
in the truth table, code signals and logic levels regarding the first active signal, a second active signal, a read active signal, and the write signal are stored while being classified according to respective bits, such that the stored code signals and logic levels are allocated as addresses in the truth table.

5. The semiconductor device according to claim 3, wherein:
with the truth table, a bank address is only allocated based on the first active signal rather than allocating the bank address based on the second active signal, the read active signal, and the write signal.

6. The semiconductor device according to claim 1, wherein the counter is configured to count the first active signal, a second active signal, and a read active signal that are sequentially input, and then activate the count signal.

7. The semiconductor device according to claim 1, wherein the counter is configured to count the first active signal, a second active signal, and the write signal that are sequentially input, and then activate the count signal.

8. The semiconductor device according to claim 1, wherein the bank includes a non-volatile memory device.

9. The semiconductor device according to claim 1, wherein:
during a read operation, a bank address is input when a first active signal from among the active signals is activated, a row address is input when a second active signal is activated, and a column address is input when a read active signal is activated.

10. The semiconductor device according to claim 9, wherein the first active signal, the second active signal, and the read active signal are sequentially input.

11. The semiconductor device according to claim 1, wherein:
during a write operation, a bank address is input when a first active signal from among the active signals is activated, a row address is input when a second active signal is activated, and a column address is input when the write signal is activated.

12. The semiconductor device according to claim 11, wherein the first active signal, the second active signal, and the write signal are sequentially input.

13. A system comprising:
a controller configured to output a command signal and a command address; and
a semiconductor device configured to store a first bank address in response to a first active signal from among the command signals, and perform the read or write operation using the stored first bank address when a command signal is activated,
wherein the semiconductor device includes;
a counter configured to output a count signal by counting an active signal when an enable signal is activated; and
a register configured to store the first bank address from among the command addresses, and output the stored first bank address as an address when the count signal is activated.

14. The system according to claim 13, wherein the semiconductor device further comprising:
a decoder configured to output the enable signal, the active signal, a read signal, and a write signal by decoding the command signal and the command address; and
a bank in which a read or write operation of data is performed, based on the address applied to the register, the read signal, and the write signal.

15. The system according to claim 14, wherein the decoder includes:
a truth table configured to store information applied to an address pin to execute a command corresponding to a function of the command signal.

16. The system according to claim 15, wherein:
with the truth table, a bank address is only allocated based on a first active signal rather than allocating the bank address based on a second active signal, a read active signal, and the write signal.

17. The system according to claim 13, wherein:
during the read operation, the semiconductor device receives a bank address when the first active signal is activated, receives a row address when a second active signal is activated, and receives a column address when a read active signal is activated; and
during the write operation, the semiconductor device receives the bank address when the first active signal is activated, receives the row address when the second active signal is activated, and receives the column address when the write signal is activated.

18. The system according to claim 17, wherein:
the first active signal, the second active signal, and the read active signal are successively input; and
the first active signal, the second active signal, and the write signal are successively input.

19. The semiconductor device according to claim 1, wherein after two active signals and a write signal are applied to the semiconductor device during three clock cycles, the semiconductor device is configured to perform the write operation.

20. The semiconductor device according to claim 1, wherein after two active signals and a read active signal are applied to the semiconductor device during three clock cycles, the semiconductor device is configured to perform the read operation based on the read signal applied to the semiconductor device.

* * * * *